United States Patent
Ismail et al.

[11] Patent Number: 5,369,067
[45] Date of Patent: Nov. 29, 1994

[54] COMPOSITE SUBSTRATES AND THEIR PRODUCTION

[75] Inventors: Morhudun G. M. U. Ismail; Zenjiro Nakai; Hiroshi Arai, all of Kumagaya, Japan

[73] Assignee: Chichibu Cement Co., Ltd., Tokyo, Japan

[21] Appl. No.: 18,752

[22] Filed: Feb. 17, 1993

[30] Foreign Application Priority Data

Feb. 19, 1992 [JP] Japan ................. 4-032315
Aug. 20, 1992 [JP] Japan ................. 4-221289

[51] Int. Cl.$^5$ ............................................. C04B 35/16
[52] U.S. Cl. ............................................. 501/119; 501/12; 501/8; 501/9; 501/120; 501/122; 501/125; 501/128
[58] Field of Search ............ 501/12, 8, 9, 119, 120, 501/122, 125, 128

[56] References Cited

U.S. PATENT DOCUMENTS

| | | | |
|---|---|---|---|
| 3,365,314 | 1/1968 | Sack ........................... | 501/8 |
| 4,301,324 | 11/1981 | Kumar et al. ................ | 174/68.5 |
| 4,814,303 | 3/1989 | Chowdhry et al. ........... | 501/119 |
| 5,030,592 | 7/1991 | Komarneni et al. .......... | 501/119 |
| 5,036,030 | 7/1991 | Taga et al. ................... | 501/125 |
| 5,091,348 | 2/1992 | Woodhead et al. .......... | 501/12 |
| 5,130,110 | 7/1992 | Rouet et al. ................. | 501/12 |
| 5,173,455 | 12/1992 | Terbot et al. ................. | 501/119 |

FOREIGN PATENT DOCUMENTS

62-252340 4/1987 Japan .

*Primary Examiner*—Karl Group
*Assistant Examiner*—C. Bonner
*Attorney, Agent, or Firm*—Zarley, McKee, Thomte, Voorhees & Sease

[57] ABSTRACT

A composite substrate is provided, which comprises a cordierite-anorthite-boron base composite material and has a microstructure with anorthite included in the cordierite phase. This substrate can be used in the form of a circuit substrate, because it has high-enough mechanical strength, a coefficient of thermal expansion close to that of silicon and a decreased dielectric constant and, moreover, can be sintered at a low temperature.

9 Claims, 4 Drawing Sheets

200.0 KV. X 50K 200.0 KV. X 50K

COMPOSITE SUBSTRATES AND THEIR PRODUCTION

BACKGROUND OF THE INVENTION

1. Field of the Invention

The present invention relates generally to a circuit substrate and particularly to a composite substrate on which, for instance, semiconductor chips are mounted, and its production. More specifically, this invention is concerned with a high-density mounting multi-layer substrate on which materials for conductors, resistors, capacitors, etc., are concurrently fired or otherwise thermally treated, and its production.

2. Prior Art

So far, alumina substrates have been used as circuit substrates. Now that a delay in the transmission speed of signals through wires that make connections between semiconductor elements has been not negligible with an increase in high-speed proceedings by such elements, however, the alumina substrates are said to be unfit for use with high-frequency circuits, etc., because of their high dielectric constants that, for instance, are 9.5 at 1 MHz. In other words, the dielectric constant of substrate material is desired to be low for enabling signals to be transmitted at high speeds. There, too, are some other demands for substrate material that it is so close in terms of the coefficient of thermal expansion to silicon that naked elements can be mounted directly on the substrate at high densities, and that it can be sintered at a low temperature of 1000° C. or below so that it can be fired or otherwise thermally heated along with electrode material having a low melting point such as Cu or Au.

To meet such demands, intensive and extensive investigations are now in the making. A typical proposal is made of a glass sintered member obtained by firing or otherwise thermally treating a compact made up of powders of a glass composition containing $SiO_2$, $Al_2O_3$ and MgO as main ingredients, characterized in that the glass composition comprises 45 to 60% by weight of $SiO_2$, 10 to 25% by weight of $Al_2O_3$, 25 to 40% by weight of MgO and up to 5% by weight of at least one nucleator selected from the group consisting of $TiO_2$, $ZrO_2$, $SnO_2$, $P_2O_5$, ZnO, $As_2O_3$ and $MoO_3$ (see JP-U-62-252340).

JP-U-62-252340 states that the sintered glass member can be fired concurrently with a low-resistant conductor metal such as silver, silver-palladium or gold, is unlikely to degrade in terms of insulating properties due to a migration phenomenon even when used in the form of multi-layer circuit board substrate material, and has a low dielectric constant.

However, a serious problem with a substrate formed of this sintered glass member is that its strength properties are less than satisfactory.

It is therefore an object of the invention to provide a substrate that has good-enough mechanical strength, when formed into a circuit substrate, has a coefficient of thermal expansion close to that of silicon and a low dielectric constant, and can be fired or otherwise thermally treated at low temperatures.

SUMMARY OF THE INVENTION

According to the invention, the object mentioned above is achieved by the provision of a composite substrate comprising a cordierite-anorthite-boron base composite material, and having a microstructure with anorthite included in the cordierite phase.

It is here preferable that the weight ratio of cordierite to anorthite lies in the range of 95-50 to 5-50, preferably 80-60 to 20-40, and that the amount of boron lies in the range of 0.5 to 10% by weight per cordierite, as calculated as $B_2O_3$. It is also preferable that the glass ingredient is neither almost nearly found in the grain boundaries nor substantially in the rest.

The present invention also provides a method for producing a composite substrate, which involves the steps of:

preparing a composite cordierite-anorthite composition sol by mixing together a boehmite sol, a silica sol, a water-soluble magnesium salt and a water-soluble calcium salt, gelating the composite cordierite-anorthite composition sol, calcining the gelated product, and sintering the calined product.

At the composite sol-preparing step, it is desired that the amount of the water-soluble calcium salt mixed with cordierite lies in the range of 1 to 10% by weight, preferably 4 to 8% by weight, as calculated as CaO. It is preferable that at the gelation step the amount of boric acid added to cordierite lies in the range of 0.5 to 10% by weight, calculated as $B_2O_3$; at the calcination step anorthite is crystallized by calcination at 850° C. to 900° C.; and at the sintering step the calcined product is sintered at a temperature of 950° C. to 1,050° C.

Another method for producing a composite substrate according to the invention involves the steps of:

preparing a composite sol by mixing together a boehmite sol, a silica sol, a water-soluble magnesium salt, a water-soluble calcium salt and a water-soluble boron compound, spraying and calcining the composite sol obtained at the composite sol-preparing step, forming the powders obtained at the spraying and calcining-step into a sheet form, and sintering the sheet.

It is desired that at the composite sol-preparing step the amount of the water-soluble calcium salt mixed with cordierite lies in the range of 1 to 10% by weight, preferably 4 to 8% by weight, calculated as CaO, and the amount of the water-soluble boron compound mixed with cordierite lies in the range of 0.5 to 10% by weight, calculated as $B_2O_3$. It is also preferable that at the spraying and calcining step the composite sol is calined at a temperature of 800° C. to 1,100° C. and at the sintering step the sheet is sintered at a temperature of 850° C. to 1,200° C.

BRIEF DESCRIPTION OF THE DRAWINGS

The present invention will now be explained, by way of example but not by way of limitation, with reference to the accompanying drawings, in which.

DETAILED EXPLANATION OF THE INVENTION

Figure 1:
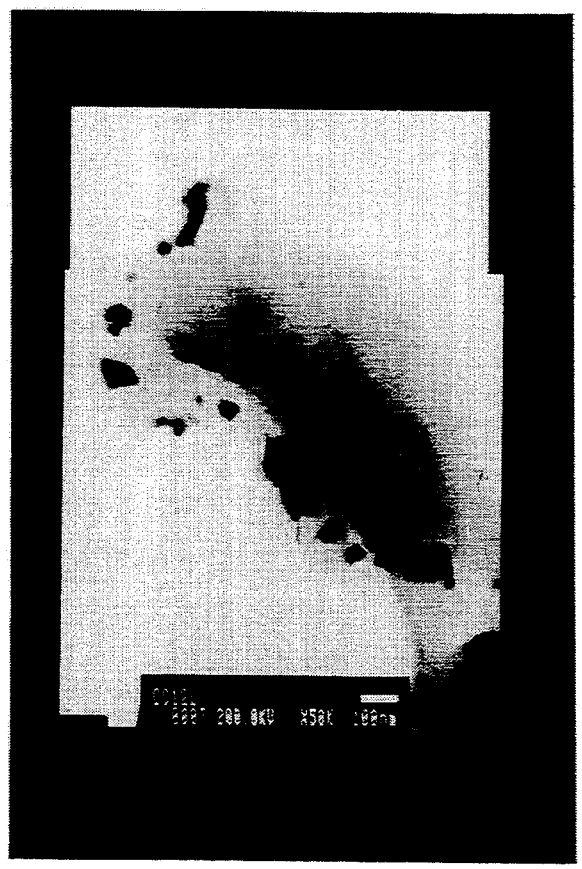
FIG. 1 is a TEM (transmission electron microscope) photograph showing the microstructure of a composite powder.

The present invention will now be explained at great length.

The invention provides a cordierite-anorthite base composite material. This is because cordierite ($2MgO \cdot 2Al_2O_3 \cdot 5SiO_2$), owing to being lower in the coefficient of thermal expansion than silicon, can be mixed to anorthite ($CaO \cdot Al_2O_3 \cdot 2SiO_2$) to form a composite material having a coefficient of thermal expansion close to that of silicon. In this connection, the coefficients of thermal expansion of cordierite, anorthite and silicon are $1.5 \times 10^{-6}/°C.$, $4 \times 10^{-6}/°C.$ and $3-4 \times 10^{-6}/°C.$, respectively. The resultant composite material lends itself well fit for circuit substrates, because it is unsusceptible to distortion, when used in the form of circuit substrates. In particular, the composite material has much more improved strength, because it consists of a microstructure with anorthite included in the cordierite phase.

Especially when the amount of CaO is adjusted to the range of 1 to 10% by weight with respect to cordierite, i.e., the weight ratio of $2MgO \cdot 2Al_2O_3 \cdot 5SiO_2/CaO \cdot Al_2O_3 \cdot 2SiO_2$ is regulated to the range of 95–50 to 5–50, the cordierite-anorthite base composite material becomes best suited for circuit substrates, because not only is its coefficient of thermal expansion closer to that of silicon but its strength is much more increased as well.

Additional incorporation of the boron component into the cordierite-anorthite composite material gives a cordierite-anorthite-boron base composite material that can be sintered at a low temperature at which any glass composition cannot, ensuring to achieve a substrate richer in strength.

According to the invention, the cordierite-anorthite (plus boron) base composite material is produced by the sol-gel technique, because this procedure enables the starting feed to be homogeneously mixed and, moreover, makes the incorporation of impurities less likely, thus assuring that higher-quality material can be obtained.

The water-soluble magnesium and calcium salts are used in the invention, and they may be used in the form of nitrates, chlorides, carbonates, and so on.

For the preparation of the composite cordierite-anorthite composititon sol, the water-soluble magnesium salt is first added to boehmite and silica sols at the theoretical composition ratio of cordierite. Then, the water-soluble calcium salt is added to the resultant cordierite composition sol.

Subsequently, the thus obtained cordierite-anorthite composite composition sol is gelated, and this is preferably done with the use of boric acid. In other words, the cordierite-anorthite-boron base composite material obtained by the gelatin with the addition of boric acid can be fired at a low temperature and, moreover, is subject to accelerated crystallization. These effects become particularly marked, when the amount—calculated as $B_2O_3$—of boric acid lies in the range of 0.5 to 10% by weight with respect to cordierite.

The thus obtained gel product is then calcined, and this is preferably done at a temperature of 850° C. to 900° C. for anorthite crystallization. To put it another way, the calcination under such conditions enables anorthite to be included in the cordierite phase, achieving a composite porcelain structure that contributes to much more increased strength.

The structure with anorthite included in the cordierite phase is preferably fired at a temperature of 950° to 1,050° C. The reasons are that at a temperature lower than 950° C. insufficient sintering takes place, resulting in insufficient strength, whereas at a temperature higher than 1,050° C. many pores occur, ending up in density and strength reductions.

Alternatively or instead of using the sol-gel technique, the composite sol may be sprayed into a heating furnace for calcination, thereby preparing spherical powders. Then, the powders are pressed along with binders and various additives into a sheet (or plate). Otherwise, the powders may be formed into a green sheet as by extrusion, doctor blading or calendering, which is then processed as by cutting, perforation, conductor printing or lamination, if required, followed by sintering. These processes, too, enable composite substrates rich in strength to be obtained. In other words, spherical powders can be prepared by the spraying and calcination of the composite sol without recourse to the gelling step, whereby composite substrates richer in strength can be obtained.

In this case, much-finer spherical powders are preferably prepared, because the finer the spherical powders the lower the sintering temperature. For instance, the spherical powders are preferably regulated to at most 10 $\mu$m, preferably at most 5 $\mu$m. It is noted that such regulation may be achieved by controlling the spraying conditions.

According to the invention, such spherical powders may be used alone or in combination with aspherical powders (preferably in an amount of up to 40% by weight). Alternatively, some part (preferably up to 40% by weight) of the spherical powders may be pulverized into aspherical powders, which are then mixed for firing.

At the spraying and calcination step a temperature of 800° to 1,100° C., esp., 850° to 1,000° C. is preferably used. The reasons are that too low a temperature is detrimental to molding (compacting), whereas too high a temperature makes particle coalescence likely to occur, resulting in particle lump formation.

At the sintering step a temperature of 850° to 1,200° C., esp., 900° to 1,100° C. is preferably used. The reasons are that at too low a temperature good-enough sintering does not go on, making strength reduction likely, whereas at too high a temperature many pores occur in the sintered member, giving rise to its density and strength reductions.

EXAMPLES

The present invention will now be explained, more specifically but not exclusively, with reference to some examples.

Example 1

An alumina (boehmite) sol that is the feed sol was first prepared by dispersing commercially available boehmite powders in an aqueous solution of 0.2N nitric acid and heating the dispersion at 80° C. under normal pressure for 3 hours.

A silica sol was obtained by dispersing commercially available colloidal silica powders in an aqueous solution of 0.2N nitric acid and regulating the pH of the dispersion to lower than 3 at normal temperature.

An aqueous solution of magnesium nitrite was added to these alumina and silica sols at $MgO:Al_2O_3:SiO_2=2:2:5$ by mole that is the theoretical composition of cordierite. After this, 2 to 10% by weight—calculated as CaO—or 10 to 50% by weight—calculated as anorthite—of an aqueous solution of calcium nitrate was added to this cordierite to prepare a composite cordierite-anorthite composition sol.

Naught decimal five (0.5) to 10% by weight—calculated as $B_2O_3$ to cordierite—of an aqueous solution of $H_3BO_3$ was added to the composite cordierite-anorthite composition sol. Within a few minutes after this, the solution became viscous and was gelled.

The thus obtained gel product was dried at 120° C. for 20 hours, then ball-milled for pulverization, and finally calcined at 850° to 900° C. The powders were found to have anorthite crystals by X-ray diffraction. A TEM photograph of the calcined powder is attached hereto in the form of FIG. 1. This shows a microstructure with anorthite included in the cordierite phase.

The powders were then uniaxially molded at a pressure of 1 t/cm$^2$, and fired at 900° to 1,100° C. to obtain a cordierite-anorthite-boron base composite porcelain member.

Figure 2:
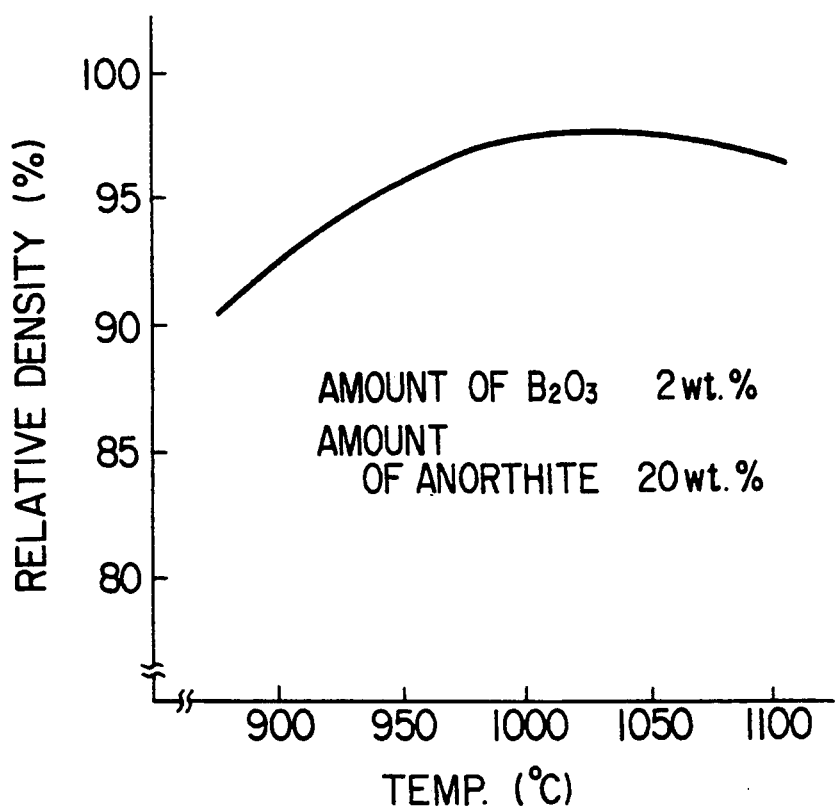
FIG. 2 is a graphical representation showing the relation between the firing temperatures and the relative densities of a sintered compact.

FIG. 2 is a graphical representation showing what relations lie between firing temperatures and relative densities when 4% by weight—calculated as CaO (or 20% by weight—calculated as anorthite) of an aqueous solution of calcium nitrate and 2% by weight—calculated as $B_2O_3$—of an aqueous solution of $H_3BO_3$ were added, and teaches that at least 95% theoretic density is achieved at a firing temperature of 950° to 1,050° C. and so reveals the feasibility of low-temperature sintering.

Figure 3:
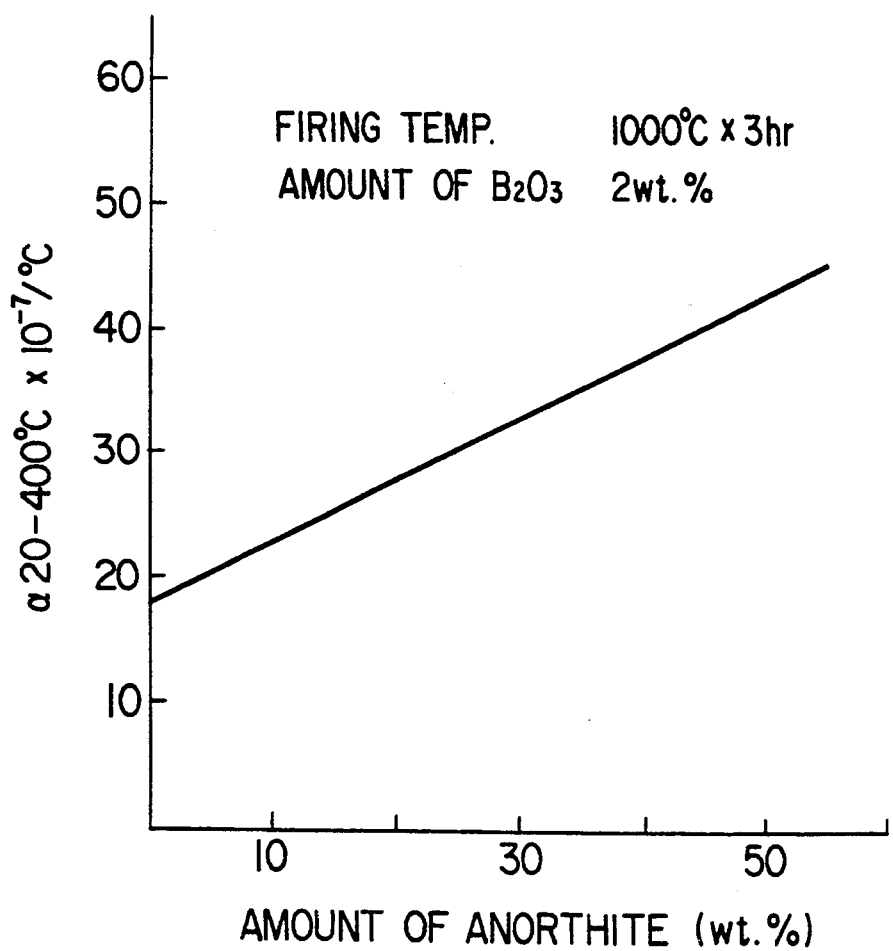
FIG. 3 is a graphical representation showing the relation between the amounts of anorthite and the coefficients of thermal expansion.

An additional examination was made of how the coefficients of thermal expansion of a cordierite-anorthite-boron base composite porcelain member (having a $B_2O_3$ content of 2% by weight and obtained by firing at 1,000° C. for 3 hours) change depending on the proportion of anorthite. The results, plotted in FIG. 3, reveal that coefficients of thermal expansion close to that of silicon are achievable when the amount of anorthite is 5% by weight or more. As can also be seen, coefficients of thermal expansion much closer to that of silicon are attainable, especially when the amount of anorthite is 20% by weight or more.

Figure 4:
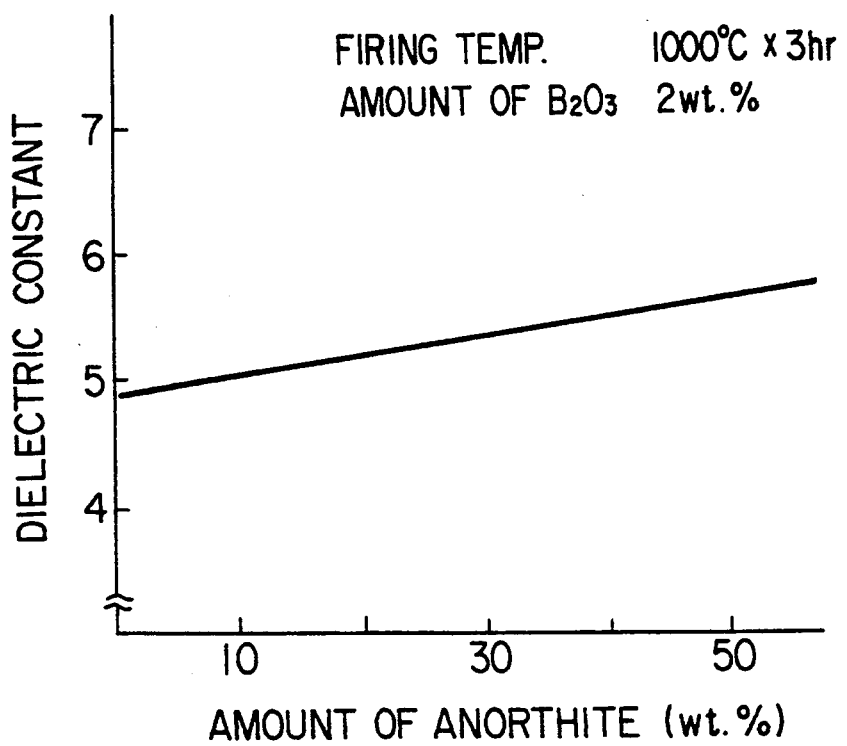
FIG. 4 is a graphical representation showing the relation between the amounts of anorthite and the dielectric constants.

A further examination was made of how the specific dielectric constant of another sample of the cordierite-anorthite-boron base composite porcelain member (having a $B_2O_3$ content of 2% by weight and obtained by firing at 1,000° C. for 3 hours) changes depending on the proportion of anorthite. The results, plotted in FIG. 4, reveals that when the amount of anorthite is up to 50% by weight, there are obtainable specific dielectric constants of 6 or less that is good-enough for practical use. As can also be seen, more preferable results are achievable at 40% by weight or less.

A still further investigation was made of the strength of a cordierite-anorthite-boron base composite porcelain. The sole use of cordierite gives rise of a three-point flexural strength of barely about 170 MPa, but composite porcelain samples having cordierite to anorthite weight ratios of 95-50 to 5-50 are on the order of 210 to 250 MPa. This teaches that some considerable strength increase is achievable by the inclusion of anorthite in the cordierite phase.

Example 2

An alumina (boehmite) sol that is the feed sol was first prepared by dispersing commercially available boehmite powders in an aqueous solution of 0.2N nitric acid and heating the dispersion at 80° C. under normal pressure for 3 hours.

A silica sol was obtained by dispersing commercially available colloidal silica powders in an aqueous solution of 0.2N nitric acid and regulating the pH of the dispersion to lower than 3 at normal temperature.

An aqueous solution of magnesium nitrite was added to these alumina and silica sols at $MgO:Al_2O_3:SiO_2=2:2:5$ by mole that is the theoretical composition of cordierite. After this, 2 to 10% by weight—calculated as CaO—or 10 to 50% by weight—calculated as anorthite—of an aqueous solution of calcium nitrate was added to this cordierite to prepare a composite cordierite-anorthite composition sol.

Naught decimal five (0.5) to 10% by weight—calculated as $B_2O_3$ to cordierite—of an aqueous solution of $H_3BO_3$ was added to and mixed with the composite cordierite-anorthite composition sol, thereby preparing a composite sol stabilized at pH 1-4.

Immediately after this, the sol was sprayed into a calcining furnace heated to 850° to 1,000° C. to obtain spherical powders.

A desired amount of water was added to 100 parts by weight of the spherical powders to make a slurry, which was then added and mixed with emulsion resin of an ethylene-vinyl acetate copolymer EVA (or -acrylic copolymer), glycerin, dibutyl phthalate and butyl carbitol acetate, each in an amount of 2 to 10 parts by weight, and 0.1 part by weight of a silicone base defoaming agent. The mixture was stirred and defoamed under reduced pressure, and formed by a doctor blade into a green sheet of 0.5 mm in thickness.

The obtained green sheets were laminated together into a plate of 4 mm thickness, and sintered at 1,000° C. for 3 hours into a sintered member.

Samples, cut from the sintered member, were subject to three-point bending tests. The results are tabulated in Table 1. Table 1 also shows the results of the cracking-upon-dried of the green sheets.

TABLE 1

| Emulsions | Green Sheets | | | |
|---|---|---|---|---|
| | (1) | (2) | (3) | (4) |
| No. 1 EVA 20 parts by weight | NF | GO | GO | 267 |
| No. 2 EVA 30 parts by weight | NF | GO | GO | 244 |
| No. 3 Acrylic 15 parts by weight | NF | GO | GO | 262 |
| No. 4 Acrylic 20 parts by weight | NF | GO | GO | 258 |
| No. 5 Acrylic 30 parts by weight | NF | GO | GO | 251 |

(1) Cracking-Upon-Dried
(2) Flexibility
(3) Laminate Bond
(4) Three-Point Flexural Strength, MPa
(NF) Not Found
(GO) Good As can be well understood from what has been described, the present invention can successfully provide a substrate material that is in a homogeneous form, contains fewer impurities, excels in mechanical strength, has a coefficient of thermal expansion close to that of silicon, possesses a low dielectric constant, can be sintered at a low temperature, and enables, for instance, Au, Ag and Cu to be used as wiring material.

What is claimed is:

1. A method for producing a composite substrate which involves the steps of:

mixing together a boehmite sol, a silica sol, a water-soluble magnesium salt and a water-soluble calcium salt to prepare a composite cordierite-anorthite composition sol, gelating said composition sol, calcining the obtained gel at from 800° C. to 1,100° C., and sintering the calcined gel to provide a composite.

2. A method as claimed in claim 1, wherein, in the composite sol-mixing step the water-soluble calcium salt is mixed in an amount of 1% to 10% by weight of said composition sol, calculated as CaO.

3. A method as claimed in claim 1, wherein, at the gelating step, boric acid is added to cordierite in an amount of 0.5 to 10% by weight, calculated as $B_2O_3$.

4. A method as claimed in claim 1, wherein calcination is at 850° C. to 900° C.

5. A method as claimed in claim 1, wherein a cordierite-anorthite composite material is obtained by sintering at 950° C. to 1,050° C.

6. A method for producing a composite substrate which involves the steps of:

mixing together a boehmite sol, a silica sol, a water-soluble magnesium salt and a water-soluble calcium salt to prepare a composite cordierite-anorthite sol, spraying and calcining said composite cordierite-anorthite sol, said calcining occurring at a temperature of 800° C. to 1,100° C.

molding the resultant powders into a sheet, and sintering said sheet.

7. A method as claimed in claim 6, wherein, at the composite: sol-preparing step, the water-soluble calcium salt is mixed in the cordierite-anorthite composite sol in an amount of 1 to 10% by weight, calculated as CaO.

8. A method as claimed in claim 6, wherein, at the composite sol-preparing step, the water-soluble boron compound is mixed in the cordierite-anorthite composite sol in an amount of 0.5 to 10% by weight, calculated as $B_2O_3$.

9. A method as claimed in claim 6, wherein, the sintering takes place at a temperature of 850° C. to 1,200° C.

* * * * *